(12) United States Patent
Ohashi

(10) Patent No.: US 6,551,910 B2
(45) Date of Patent: Apr. 22, 2003

(54) METHOD OF MANUFACTURING SOLID-STATE IMAGE PICKUP DEVICE

(75) Inventor: Masanori Ohashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/837,252

(22) Filed: Apr. 18, 2001

(65) Prior Publication Data

US 2002/0003611 A1 Jan. 10, 2002

(30) Foreign Application Priority Data

Apr. 19, 2000 (JP) ........................................ 2000-117326

(51) Int. Cl.[7] ....................... H01L 21/265; H01L 21/00; H01L 21/339; H01L 21/336
(52) U.S. Cl. ........................ 438/519; 438/60; 438/75; 438/144; 438/307; 438/525; 438/529
(58) Field of Search ............................... 438/60, 75, 78, 438/79, 144, 145, 146, 147, 148, 194, 303, 305–307, 420, 451, 519, 525, 527–529

(56) References Cited

U.S. PATENT DOCUMENTS

| 3,914,857 | A | * | 10/1975 | Goser et al. ................. 29/579 |
| 5,567,632 | A | * | 10/1996 | Nakashiba et al. ........... 437/35 |
| 5,705,410 | A | * | 1/1998 | Guegan ....................... 437/35 |
| 6,114,210 | A | * | 9/2000 | Wu et al. .................... 438/302 |
| 6,333,526 | B1 | * | 12/2001 | Tanabe ....................... 257/227 |
| 6,194,278 | B1 | * | 2/2002 | Rengarajan ................ 438/302 |
| 6,221,686 | B1 | * | 4/2002 | Drowley et al. ............. 438/57 |

* cited by examiner

Primary Examiner—John F. Niebling
Assistant Examiner—Viktor Simkovic
(74) Attorney, Agent, or Firm—Robert J. Depke; Holland & Knight LLC

(57) ABSTRACT

In a method of manufacturing a solid-state image pickup device having a virtual gate structure, in a process of forming a profile of a sensor portion, when ion implantation to form a p+ type layer at a substrate surface side is carried out while the ion implantation direction is tilted with respect to the substrate surface, the ion implantation is divisively carried out at plural times and from multiple ion implantation directions so that the total dose amount is matched, whereby impurities can be implanted into any area of the sensor portion and thus no impurities-unformed area occurs.

5 Claims, 4 Drawing Sheets

(STEP 1)

(STEP 2)

(STEP 3)

ELECTRODE OPENING CONSTRICTION

SENSOR PORTION p+ IMPLANTATION DIRECTION

SENSOR PORTION p+ UNFORMED AREA

METHOD OF MANUFACTURING SOLID-STATE IMAGE PICKUP DEVICE

RELATED APPLICATION DATA

The present application claims priority to Japanese Application No. P2000-117326 filed Apr. 19, 2000, which application is incorporated herein by reference to the extent permitted by law.

BACKGROUND OF THE INVENTION

The present invention relates to a method of manufacturing a solid-state image pickup device, and particularly to a method of manufacturing a sensor portion in a solid-state image pickup device having a virtual gate structure that a substrate surface side of a sensor area is pinned.

In a solid-state image pickup device, for example, a CCD (Charge Coupled Device) type image pickup device, a sensor photodetecting portion for performing photoelectric conversion (hereinafter referred to as "sensor portion") comprises an n-type layer for photoelectrically converting incident light to charges and accumulating the charges thus obtained, a p-type layer for forming an overflow barrier, and a p-type high-concentration (p+) layer for pinning the surface of an Si substrate so as to suppress emission of charges (dark current) occurring due to interface level. Here, if the pinning effect of the p+ layer on the surface of the Si substrate is insufficient, the dark current component would be increased and the image quality under a dark condition is adversely effected.

In a case where a profile of a sensor portion is formed, it is general that a transfer electrode of a vertical transfer portion is formed of, for example, polysilicon, and then ion implantation of impurities is carried out in self-alignment with the transfer electrode as a mask, excluding an overflow barrier. Further, the ion implantation to form the profile aims to prevent channeling to Si crystal. In order to offset a p+ region and an n+ region with each other intentionally, the ion implantation is generally carried out at an inclined (tilt) angle of several degrees with respect to the surface of the Si substrate from a predetermined direction.

This offset can reduce a read-out voltage when charges accumulated in the sensor portion are read out to a vertical transfer channel, and also adjust suppression of the blooming phenomenon that charges overflow into the vertical transfer channel at the time when a large amount of light is incident. However, the optimum offset combination (p+, n+ implantation directions) is three-dimensionally determined by a unit cell size and the potential of the sensor portion and the vertical transfer channel, and thus the optimum combination of the ion implantation directions would be varied in accordance with a profile design.

Besides, the shape of the transfer electrode of the vertical transfer portion simultaneously determines the shape of the sensor area. At this time, for an ideal shape, it is actual that constriction occurs in the opening shape of the sensor portion due to working problems such as a photolithography resolution problem, a matching precision problem, etc. as shown in FIG. 7. Accordingly, if impurities are doped from one direction by ion implantation, the impurities would not be doped into the constriction site, and thus an impurities-unformed area occurs.

Further, since the transfer electrode of the vertical transfer portion has a thickness of about 300 nm to 700 nm, shadow occurs due to the film thickness by the effect of the tilt angle when the ion implantation is carried out. Therefore, an area into which no impurities are implanted necessarily occurs at the edge portion of the vertical transfer electrode although the area is small as shown in FIG. 8. Particularly, in cooperation with the lower implantation energy of the ion doping of boron used to form the p+ layer on the surface of the substrate, a p+ unformed area is liable to occur at the edge of the vertical transfer electrode.

It is somewhat expected that impurities are diffused in the lateral direction due to a thermal treatment after the ion implantation. However, since the impurities-unformed area exists at the edge of the transfer electrode of the vertical transfer portion, it is liable to be depleted when a positive voltage is applied to the transfer electrode concerned. Therefore, the pinning effect would be insufficient if no countermeasure is taken. As a result, dark current is liable to occur, and also the dark current characteristic becomes unstable due to dispersion of the work shape of the vertical transfer electrode, so that the image quality is adversely effected.

SUMMARY OF THE INVENTION

The present invention has been implemented in view of the above circumstances, and has an object to provide a method of manufacturing a solid-state image pickup device which can stably suppress dark current occurring in a sensor portion.

In order to achieve the above object, a method of manufacturing a solid-state image pickup device having a virtual gate structure that a substrate surface side of a sensor area is pinned, is characterized in that when ion implantation of impurities to form a profile for pinning the substrate surface side of the sensor area is carried out at a predetermined implantation angle with respect to the surface of the substrate, the ion implantation is carried out while its operation is divided to plural times (stages) and also carried out from multiple ion implantation directions.

In the solid-state image pickup device having the virtual gate structure, when impurities to form the profile for pinning the substrate surface side of the sensor area are doped by ion implantation in the process of forming the sensor portion, channeling can be prevented by inclining the ion implantation direction with respect to the surface of the substrate by several angles. The ion implantation is carried out while being divided into plural times (plural sub ion implantation operations) and also the respective sub ion implantation operations are carried out from different directions (i.e., the ion implantation is divisively carried out from multiple ion implantation directions), whereby no impurities-unformed area occurs in any area of the sensor area.

DETAILED DESCRIPTION OF THE PREFERRED EMBODIMENT

A preferred embodiment according to the present invention will be described hereunder with reference to the accompanying drawings.

Figure 1:
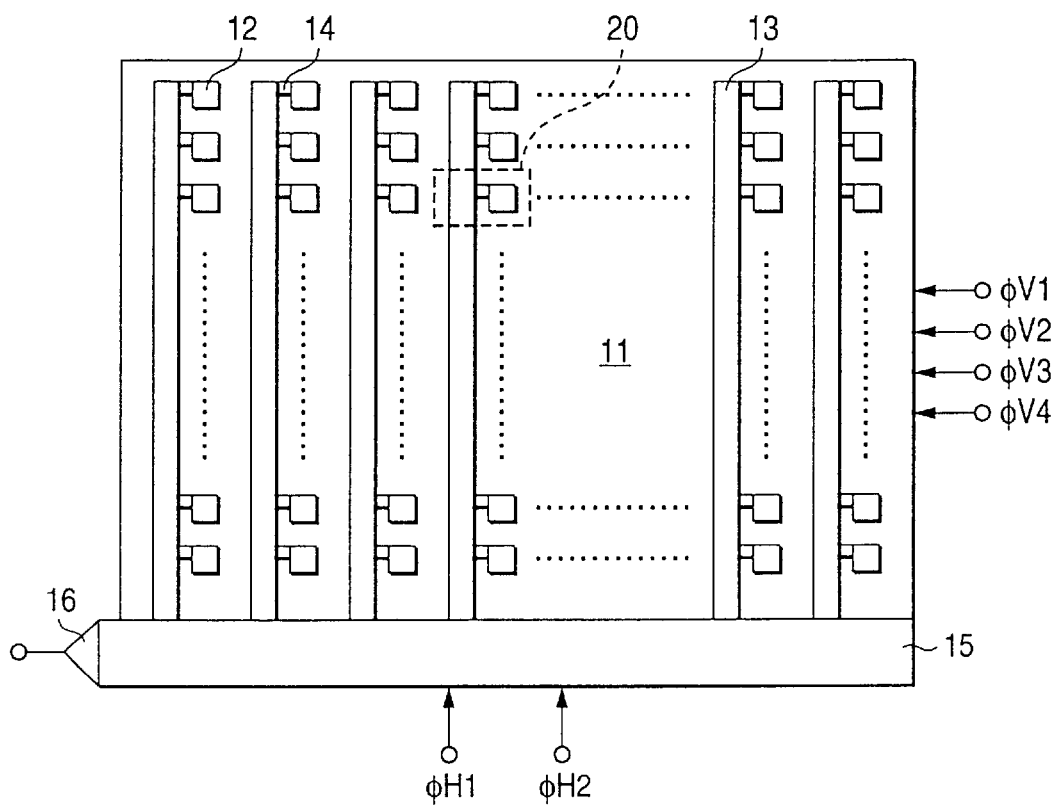
FIG. 1 is a diagram showing an embodiment of a CCD area sensor to which the present invention is applied.

FIG. 1 is a diagram showing the construction of an embodiment of a CCD area sensor to which the present invention is applied. However, the present invention is not limited to the CCD area sensor, and the present invention may be applied to a general solid-state image pickup device such as a CCD type linear sensor or the like insofar as it has a virtual gate structure in which a substrate surface side of a sensor area is pinned.

In FIG. 1, an image pickup portion (image pickup area) 11 includes a plurality of sensor portions (pixels) 12 formed and arranged in a matrix form on a semiconductor substrate (not shown), a plurality of vertical CCDs 13 arranged along the array direction of the pixels every vertical array of the sensor portion 12, and a plurality of read-out gate portions 14 each of which is provided between each sensor portion 12 and each vertical CCD 13 and serves to read out signal charges from the sensor portion 12 to the vertical CCD 13.

In the image pickup portion 11, each sensor portion 12 comprises a photodiode of pn junction, for example, and it converts incident light to a signal charge having the charge amount corresponding to the light amount of the incident light and accumulates the signal charge. The transfer operation of the vertical CCD 13 is carried out by four-phase vertical transfer pulses φV1 to φV4, and the signal charge read out from each sensor portion 12 through the read-out gate portion 14 is successively transferred in the vertical direction on a line basis.

Four transfer electrodes to which four-phase vertical transfer pulses φV1 to φV4 are applied are repetitively arranged in the transfer direction on the transfer channel of the vertical CCD 13. The transfer electrodes to which the first-phase and third-phase vertical transfer pulses φV1 to φV3 are applied also serve as the gate electrodes of the read-out gate portion 14.

A horizontal CCD 15 for transferring in the horizontal direction the signal charges which are successively and vertically transferred from the vertical CCD 13 is disposed at the lower side of the image pickup portion 11, that is, at the transfer destination side of the signal charges by the vertical CCD 13. The horizontal CCD 15 is transfer-driven by two-phase horizontal transfer pulses φH1 and φH2, for example. A charge/voltage converting portion 16 comprising, for example, a floating diffusion amplifier is disposed at the edge portion of the transfer destination side of the vertical CCD 15.

Figure 2:
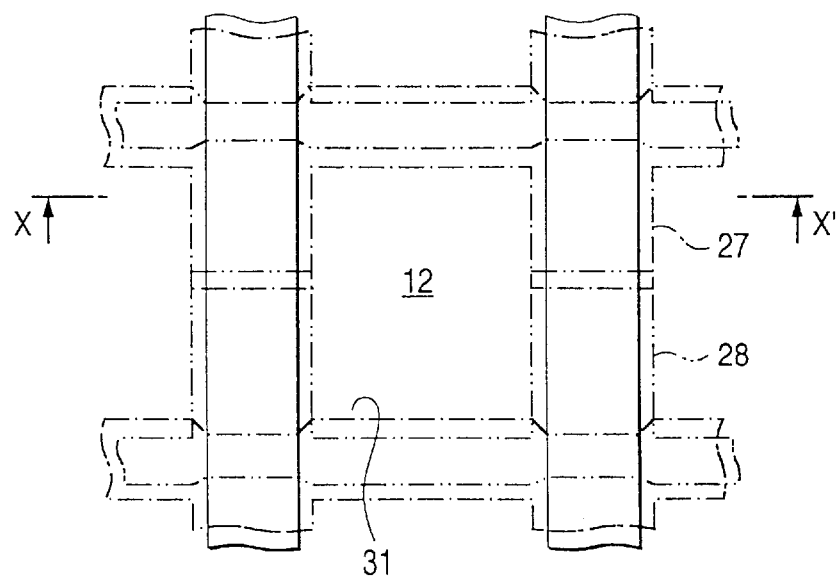
FIG. 2 is a plan pattern diagram showing the structure of a unit cell.
Figure 3:
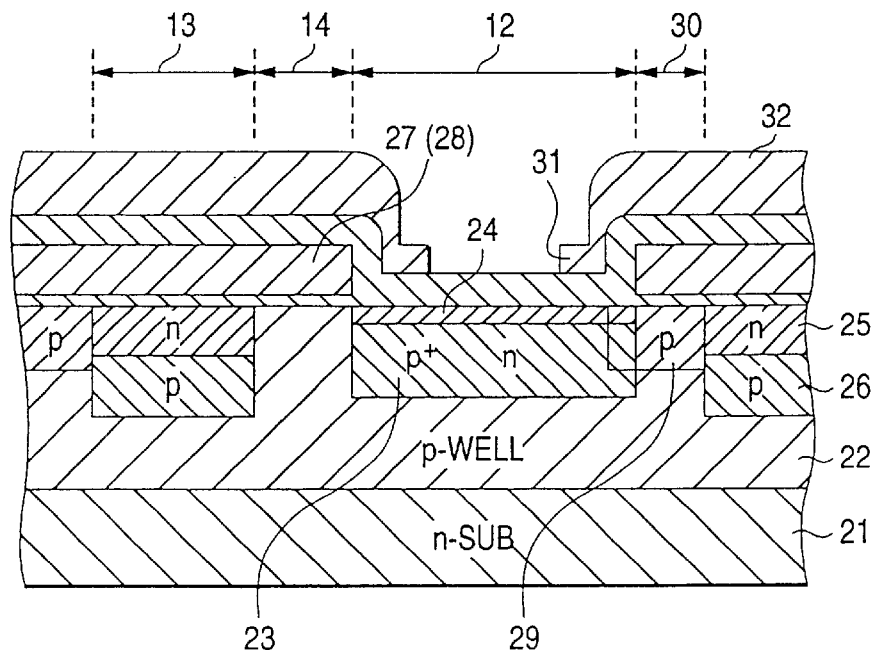
FIG. 3 is a cross-sectional view showing the structure of the unit cell, which is taken along a line X-X' of FIG. 2.

FIG. 2 is a plan pattern diagram showing the structure of a unit cell (unit pixel) 20, and FIG. 3 is a cross-sectional view showing the structure of the unit cell, which is taken along a line X-X' of FIG. 2.

In FIGS. 2 and 3, a p-type layer to form an overflow barrier, that is, a p-type well 22 is formed on an n-type Si substrate 21. An n-type layer 23 is formed on the p-type well 22, whereby a sensor portion 12 comprising a photodiode based on pn junction is constructed.

The sensor portion 12 has a virtual gate structure that a p-type high concentration (p+) layer 24 for pinning the Si interface so that emission of charges (dark current) occurring due to interface level is suppressed is formed at the substrate surface side of the sensor area. In this sensor portion 12, signal charges occurring through the photoelectric conversion are accumulated in the n-type layer 23.

The vertical CCD 13 comprises an n-type layer 25 and a p-type layer 26 below the n-type layer which are formed as a buried channel, and transfer electrodes 27, 28 which are formed of polysilicon above the n-type layer 25 to have a two-layer structure. In FIG. 2, the transfer electrode 27 of the first layer is indicated by a one-dotted chain line, and the transfer electrode 28 of the second layer is indicated by a two-dotted chain line. These transfer electrodes are formed so as to extend to the edge of the sensor portion 12. For example, the transfer electrode to which the first-phase and second-phase vertical transfer pulses φV1, φV3 are applied also serves as the gate electrode of the read-out gate portion 14.

A p-type layer 29 constituting a channel stop portion 30 is formed at the opposite side of the sensor portion 12 to the vertical CCD 13, and the upper portions of the transfer electrodes 27, 28 of the vertical CCD 13 are covered by a light shielding film 32 of aluminum or the like while an sensor opening portion 31 is formed on the sensor portion 12, thereby preventing external light from being incident to the n-type layer 25 of the vertical CCD 13.

Figure 4:
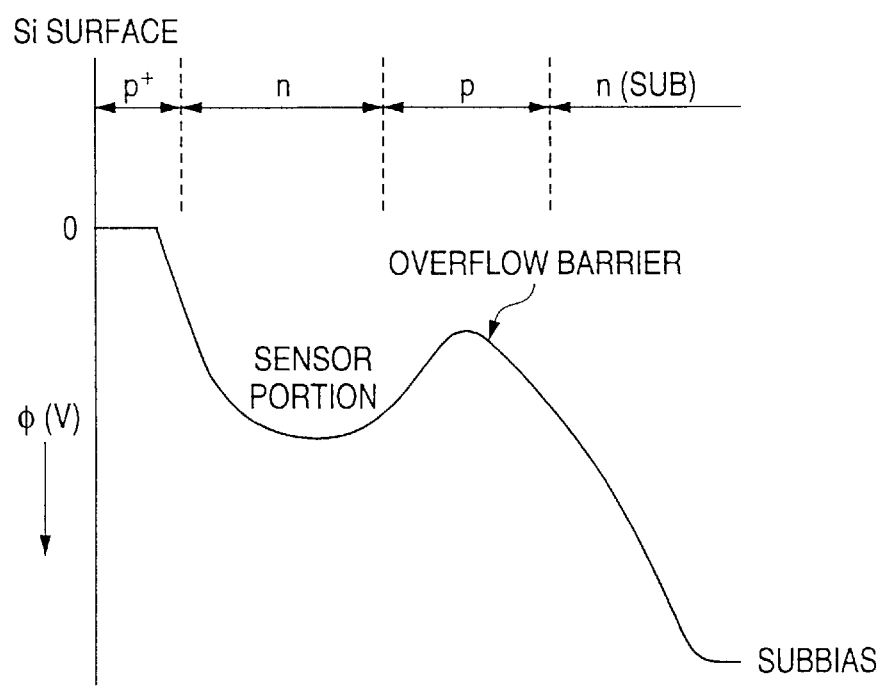
FIG. 4 is a diagram showing an impurities-profile in the depth direction of a substrate of a sensor portion 12.

As the final structure of the sensor portion 12, a color filter, a microlens, etc. are formed in an on-chip structure, however, these elements are omitted from FIGS. 2 and 3. In the above construction, one sensor portion 12, the corresponding transfer stage of the vertical CCD 13 and the corresponding read-out gate portion 14 constitute the unit cell 20. FIG. 4 shows the impurities profile in the depth direction of the substrate of the sensor portion 12.

Figure 5:
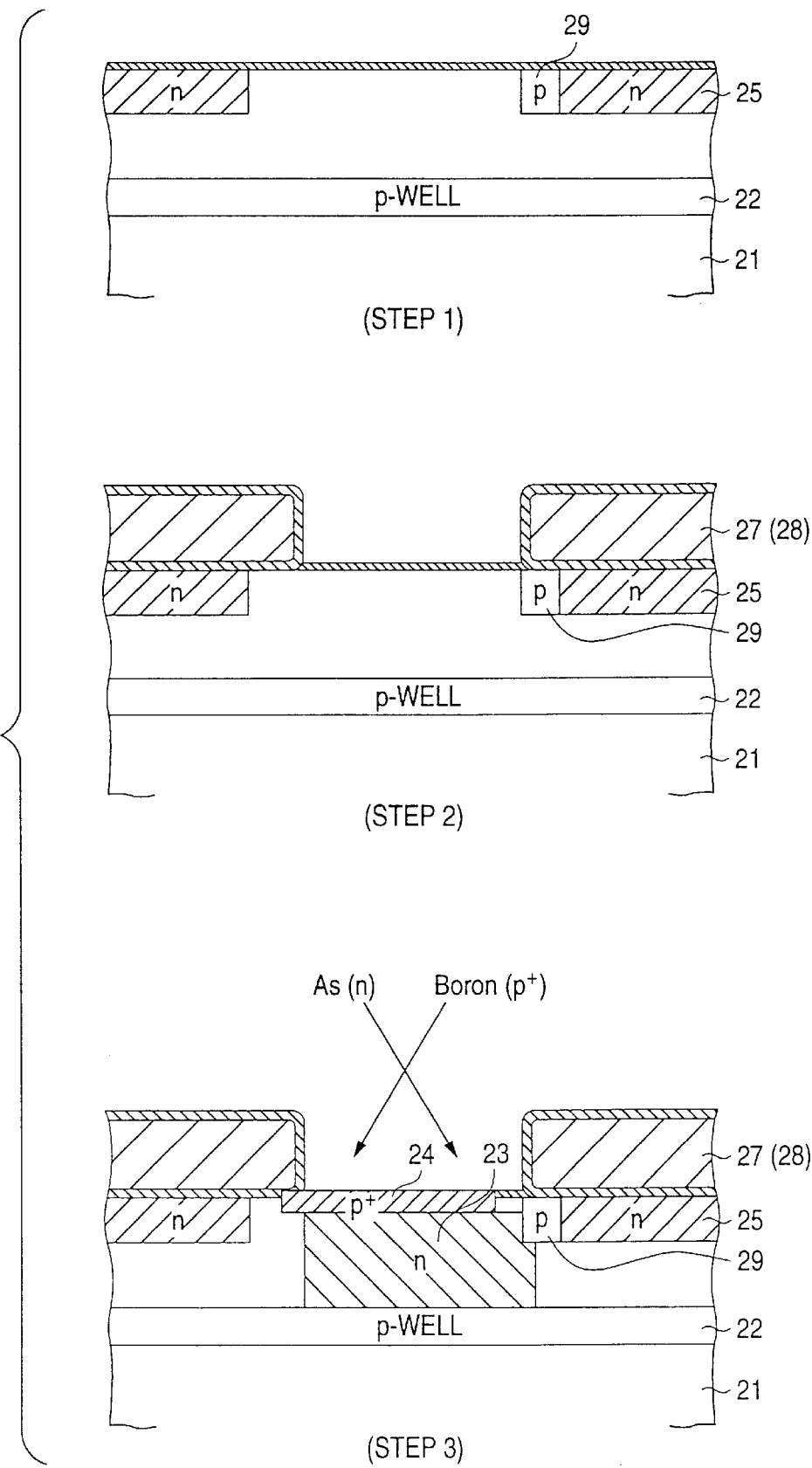
FIG. 5 is a diagram showing the manufacturing steps of a profile forming method of the sensor portion.

Next, a method of forming when the profile of the sensor portion 12 thus constructed is formed will be described with reference to the process diagrams of FIG. 5.

First, an n-type layer 25 serving as a buried channel of the vertical CCD 13 and the p-type layer 29 of the channel stop portion 30 are formed on the substrate surface side by ion implantation (step 1). Subsequently, the transfer electrodes 27, 28 of the vertical CCD 13 are formed of polysilicon in the two-layer structure, for example (step 2).

After the transfer electrodes 27, 28 of the vertical CCD 13 are formed, ion implantation when the sensor portion 12 is formed is carried out in self-alignment by using the transfer electrodes 27, 28 as a mask (step 3). The ion implantation to form the profile of the sensor portion 12 is generally carried out from any direction while the implantation direction is tiled with respect to the surface of the Si substrate in order to prevent the channeling to Si crystal and also intentionally offset the n-type layer 23 and the p+ type layer 24 with each other as described in "Description of the Related Art".

As described above, in the case where the impurities (boron) are ion-implanted while the implantation direction is tilted with respect to the Si substrate surface, according to the manufacturing method of the present invention, when the p+ type layer 24 is formed on the substrate surface side of the sensor portion 12, the ion implantation is carried out while being divided into plural times (i.e., sub ion implantation stages) so that the total of the dose amounts in the sub ion implantation stages is equal to the dose amount when the ion implantation operation is carried out at a time, and also the respective sub ion implantation operations are carried out from different directions (i.e., the ion implantation is carried out from multiple directions).

Figure 6A:
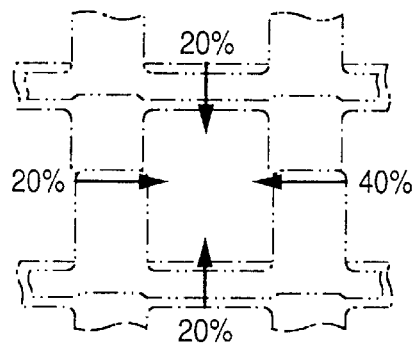
FIGS. 6A and 6B are diagrams showing an impurities implantation direction and a dose amount rate.

For example, in the case where the total dose amount of the boron ion implantation to form the p+ type layer 24 is equal to $1.0E13cm^2$, in order to keep the blooming margin, the ion implantation (a first sub ion implantation operation) of a dose amount of $0.4E13cm^2$ (40%) is carried out in the direction to the read-out gate portion 14 (the direction indicated by an arrow (←) in FIG. 6A), and the ion implantation of the residual dose amount of $0.6E13cm^2$ (60%) is carried out in the directions indicated by arrows in FIG. 6A), that is, it is carried out while being divided into the second to fourth sub ion implantation operations that are respectively carried out at a dose amount of $0.2E13cm^2$ (20%) in each of the direction to the channel stop portion 30 (the direction indicated by an arrow (→)) and the up/down directions between upper and lower pixels (the directions indicated by arrows (↑,↓)).

As described above, when the p+ type layer 24 is formed at the substrate surface side in the profile forming step of the sensor portion 12, the ion implantation is divided into plural times (plural sub ion implantation operations) and carried out from multiple directions so that the total dose amount of the sub ion implantation operations is equal to that of the original ion implantation, whereby the impurities can be implanted into any area of the sensor portion 12. Therefore, there can be prevented occurrence of an impurities-unformed area into which no impurities (p+) are implanted because the area is hidden by the transfer electrodes 27, 28 of the vertical CCD 13.

Accordingly, the dark current occurring in the sensor portion 12 (occurrence level) can be stably suppressed. Particularly, there can be suppressed the dark current due to the dispersion of the working precision such as the photolithography resolution, the matching precision, etc. when the transfer electrodes 27, 28 of the vertical CCD 13 are formed. Therefore, the dark current characteristic between the solid-state image pickup devices can be stabilized.

The dose amount rate of each implantation direction when the ion implantation is divisively carried out at plural times may be varied, and the optimum combination of the dose amount rate can be selected in accordance with the basic characteristic of the device.

Further, the ion implantation direction is not limited to the four directions (up/down and right/left directions), and it may be expanded to further multiple directions in accordance with the shape of the sensor opening portion 31 (see FIG. 2). In place of the division of the ion implantation direction into multiple directions, the ion implantation direction may be continuously varied, that is, rotating ion implantation may be carried out to prevent occurrence of an impurities-unformed area.

Figure 6B:
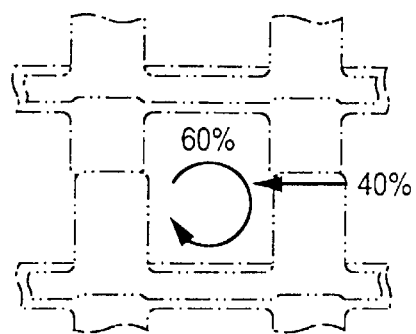
Figure 7:
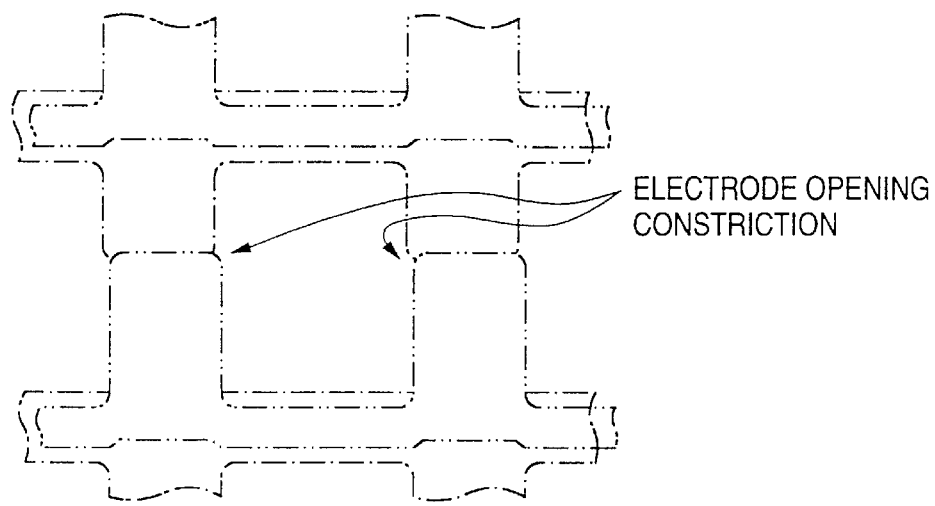
FIG. 7 is a plan pattern diagram showing a state that an opening portion constriction occurs in a transfer electrode due to insufficient working precision.
Figure 8:
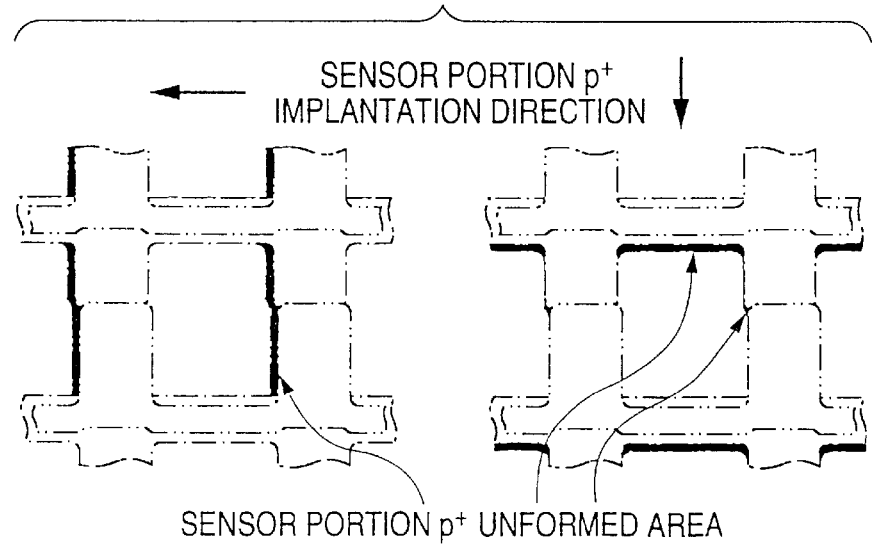
FIG. 8 is a plan pattern diagram showing a state that an impurities-unformed area occurs.

As shown in FIG. 6B, the rotating ion implantation and the normal ion implantation (or divided ion implantation) may be combined. In this case, the normal ion implantation is carried out while increasing the dose amount rate of a desired ion implantation direction, and then the residual dose amount is supplemented by the rotating ion implantation, whereby not only the reduction of the read-out voltage to be applied to the gate electrode of the read-out gate portion 14 and the keeping of the blooming margin, but also the reduction of the dark current can be achieved.

As described above, according to the present invention, in the method of manufacturing the solid-state image pickup device having the virtual gate structure, when the ion implantation of impurities to form a profile for pinning the substrate surface side of the sensor area is carried out at a prescribed ion implantation angle with respect to the substrate surface, the ion implantation is divided into plural times, and it is divisively carried out from multiple directions. Therefore, the impurities can be implanted into any area of the sensor area, and occurrence of an impurities-unformed area can be prevented, so that the dark current occurring in the sensor portion can be stably suppressed.

What is claimed is:

1. A method of manufacturing a solid-state image pickup device having a virtual gate structure where a substrate surface side of a sensor area is pinned, characterized in that when ion implantation of impurities for pinning the substrate surface side of the sensor area is performed, the ion implantation is carried out multiple times and from multiple ion implantation directions.

2. The method as claimed in claim 1, wherein when the ion implantation is performed multiple times, the dose amount rate is varied for each ion implantation direction.

3. A method of manufacturing a solid-state image pickup device comprising the steps of:

forming a plurality of transfer electrodes;

after the step of forming the plurality of transfer electrodes, pinning a surface of the sensor area by ion implantation that is performed in multiple steps from multiple ion implantation directions.

4. The method as claimed in claim 3, wherein when the ion implantation is performed multiple times, the dose amount rate is varied for each ion implantation direction.

5. The method as claimed in claim 3, wherein no ion implantation is performed that from a direction that is substantially normal to the surface.

* * * * *